United States Patent
Ishida et al.

(10) Patent No.: US 7,968,993 B2
(45) Date of Patent: Jun. 28, 2011

(54) STACKED SEMICONDUCTOR DEVICE AND SEMICONDUCTOR MEMORY DEVICE

(75) Inventors: Katsuhiro Ishida, Yokkaichi (JP); Ryoji Matsushima, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 541 days.

(21) Appl. No.: 12/170,062

(22) Filed: Jul. 9, 2008

(65) Prior Publication Data
US 2009/0014894 A1  Jan. 15, 2009

(30) Foreign Application Priority Data

Jul. 13, 2007 (JP) ................. 2007-184467

(51) Int. Cl.
*H01L 23/02* (2006.01)
(52) U.S. Cl. ........................ 257/686; 257/777
(58) Field of Classification Search .................. 257/686, 257/777, 723, 724, 784
See application file for complete search history.

(56) References Cited

U.S. PATENT DOCUMENTS

| | | | |
|---|---|---|---|
| 5,847,445 A * | 12/1998 | Wark et al. | 257/669 |
| 6,380,634 B1 | 4/2002 | Umehara | |
| 6,683,385 B2 * | 1/2004 | Tsai et al. | 257/777 |
| 7,352,068 B2 * | 4/2008 | Kuroda et al. | 257/777 |
| 7,514,796 B2 * | 4/2009 | Saeki | 257/777 |
| 7,541,680 B2 * | 6/2009 | Kwon et al. | 257/777 |
| 7,795,741 B2 * | 9/2010 | Kikuchi et al. | 257/777 |
| 7,868,462 B2 * | 1/2011 | Choi et al. | 257/777 |
| 2004/0201088 A1 | 10/2004 | Kim et al. | |
| 2006/0175697 A1 * | 8/2006 | Kurosawa et al. | 257/686 |

FOREIGN PATENT DOCUMENTS

JP  2005-116915  4/2005

* cited by examiner

*Primary Examiner* — S. V Clark
(74) *Attorney, Agent, or Firm* — Oblon, Spivak, McClelland, Maier & Neustadt, L.L.P.

(57) ABSTRACT

A stacked semiconductor device includes a first semiconductor element mounted on a wiring board and a second semiconductor element stacked on the first semiconductor element. Electrode pads of the first and second semiconductor elements are electrically connected to connection pads of the wiring board via first and second metal wires. The second metal wire is wired so that a part thereof is in contact with an insulating protective film covering a surface of the first semiconductor element.

20 Claims, 5 Drawing Sheets

STACKED SEMICONDUCTOR DEVICE AND SEMICONDUCTOR MEMORY DEVICE

CROSS-REFERENCE TO RELATED APPLICATIONS

This application is based upon and claims the benefit of priority from the prior Japanese Patent Application No. 2007-184467, filed on Jul. 13, 2007; the entire contents of which are incorporated herein by reference.

BACKGROUND OF THE INVENTION

1. Field of the Invention

The present invention relates to a stacked semiconductor device and a semiconductor memory device.

2. Description of the Related Art

A stacked semiconductor device in which plural semiconductor elements are stacked and sealed inside one package is in practical use to realize miniaturization and high-density mounting of a semiconductor device. The plural semiconductor elements are sequentially stacked on a circuit substrate such as a wiring board and a lead frame via adhesive layers in the stacked semiconductor device. Electrode pads of the semiconductor element are electrically connected to connection portions of the circuit substrate via bonding wires. The stacked body as stated above is resin-sealed, and thereby, a semiconductor device in a stacked multi-chip package structure is constituted.

A semiconductor memory device is constituted by one or plural memory element(s) and a controller element. When a stacked structure is applied to the semiconductor memory device, the controller element smaller than the memory element is stacked on one or multiple stacked memory element(s). Accordingly, bonding length for the small-sized controller element (the semiconductor element at an upper side) stacked on the large-sized memory element(s) (the semiconductor element(s) at a lower side) becomes inevitably long. There is a tendency in which the bonding wires connected to the upper side semiconductor element form long loops as element shapes are different. Further, the bonding wire in itself has a tendency to be finer in accordance with miniaturization of a pad area of the semiconductor element.

When a stacked body of the plural semiconductor elements are resin-sealed, the bonding wire connected to the upper side semiconductor element is easy to deviate (a wire flow), and it becomes a factor causing a short-failure and so on resulting from a contact between adjacent different potential wires. The wire flow is easier to occur as the bonding wire forms long loop, further as the bonding wire becomes finer. In particular, phenomena in which a rising portion from a circuit substrate and a bent point from a flat portion fall down are more problems than the deviation at the flat portion of the bonding wire stretched in equilibrium to a substrate surface (a horizontal surface) in the wire flow.

In JP-A 2005-116915 (KOKAI), it is disclosed that one end of a metal wire is ball-connected to an electrode pad of a semiconductor element, and thereafter, the metal wire is wound off while being in contact with a surface insulating film of the semiconductor element to which the metal wire is connected, and the other end of the metal wire is pressure-bonded to connect to an external terminal. Here, the metal wire is brought into contact with an element surface in itself to which the metal wire is connected so as to prevent that the metal wire is in contact with an element end portion (a corner portion) when the metal wire is connected to the electrode pad provided in a vicinity of a center of the semiconductor element. It is not considered to prevent the wire flow at a resin-sealing time of the metal wire, and further the wire flow of the metal wire connected to the upper side semiconductor element in the stacked semiconductor device.

BRIEF SUMMARY OF THE INVENTION

A stacked semiconductor device according to an aspect of the present invention, includes: a circuit substrate having an element mounting portion and connection portions; a first semiconductor element, mounted on the element mounting portion of the circuit substrate, having a first element main body, first electrode pads disposed at a surface of the first element main body, and a first insulating protective film covering the surface while exposing the first electrode pads; a second semiconductor element, stacked on the first semiconductor element, having a second element main body, second electrode pads disposed at a surface of the second element main body, and a second insulating protective film covering the surface while exposing the second electrode pads; first metal wires electrically connecting the connection portions and the first electrode pads; second metal wires electrically connecting the connection portions and the second electrode pads, the second metal wires being wired so that a part thereof is in contact with the first insulating protective film; and a resin-sealing portion sealing the first and second semiconductor elements together with the first and second metal wires.

A semiconductor memory device according to another aspect of the present invention includes: a circuit substrate having an element mounting portion and connection portions; a memory element group including at least one semiconductor memory element mounted on the element mounting portion of the circuit substrate, the semiconductor memory element having an element main body, first electrode pads disposed at a surface of the element main body, and an insulating protective film covering the surface while exposing the first electrode pads; a controller element, stacked on the memory element group, having second electrode pads; first metal wires electrically connecting the connection portions and the first electrode pads; second metal wires electrically connecting the connection portions and the second electrode pads, the second metal wires being wired so that a part thereof is in contact with the insulating protective film of the semiconductor memory element; and a resin-sealing portion sealing the memory element group and the controller element together with the first and second metal wires.

DETAILED DESCRIPTION OF THE INVENTION

Figure 1:
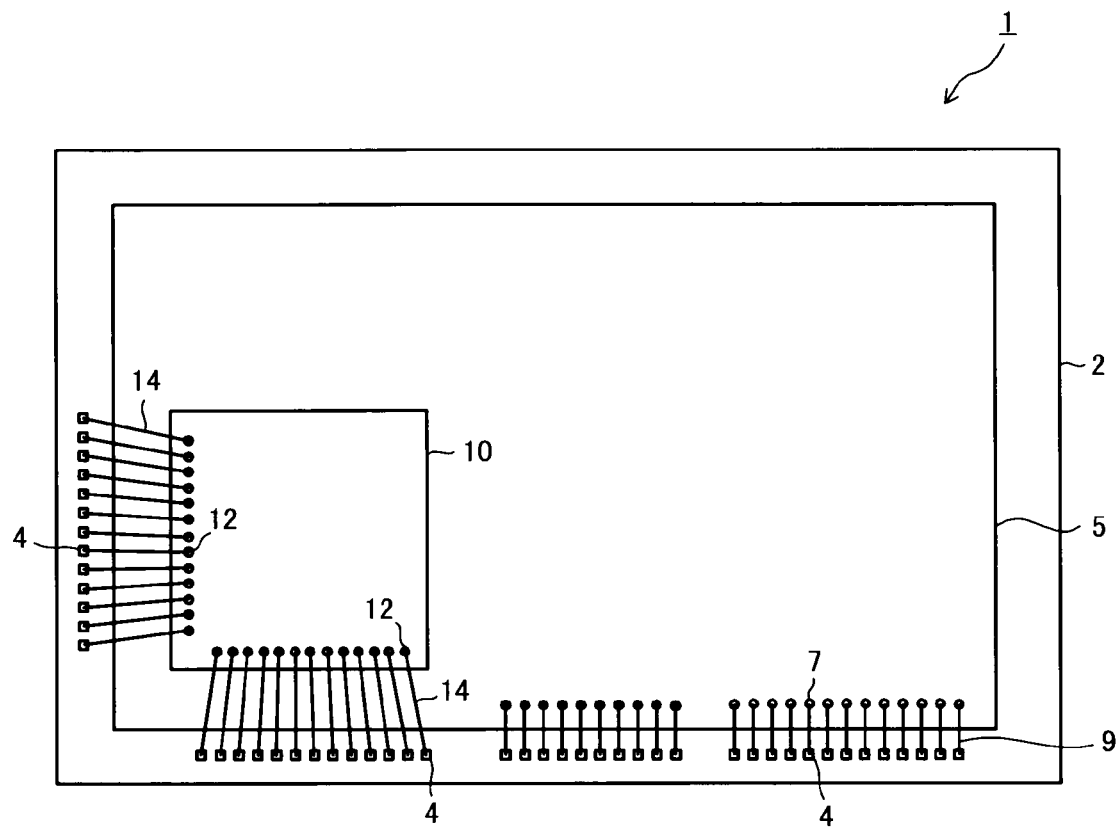
FIG. 1 is a plan view showing a stacked semiconductor device according to an embodiment of the present invention.
Figure 2:
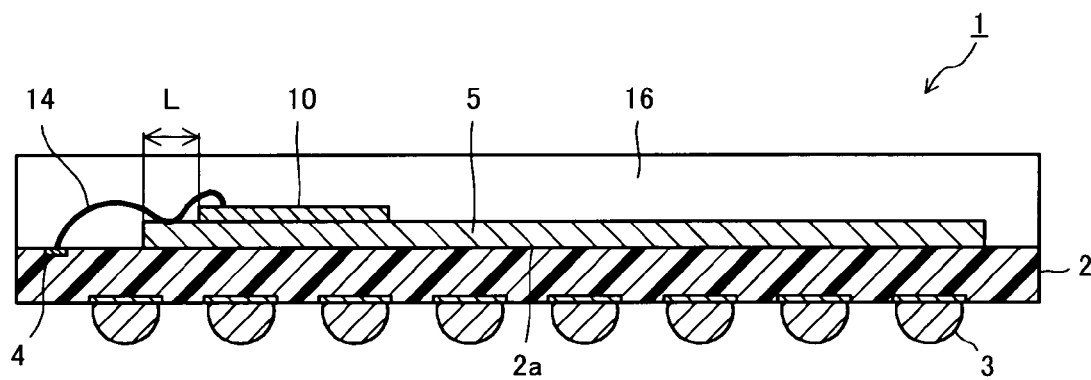
FIG. 2 is a sectional view of the stacked semiconductor device shown in FIG. 1.
Figure 3:
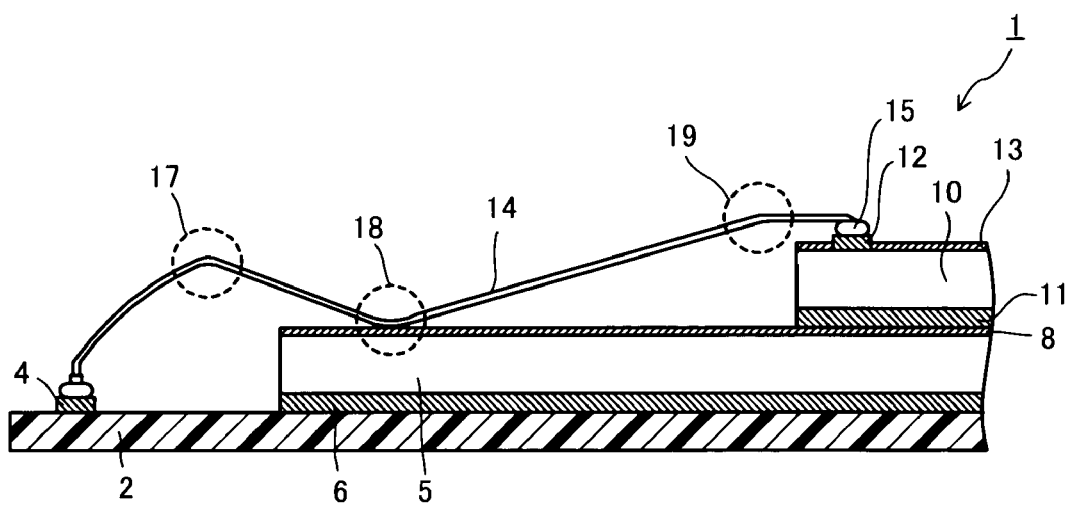
FIG. 3 is a sectional view enlargedly showing a part of the stacked semiconductor device shown in FIG. 1.

Hereinafter, embodiments of the present invention are described. FIG. 1 is a plan view showing a configuration of a stacked semiconductor device according to an embodiment of the present invention, FIG. 2 is a sectional view thereof, and FIG. 3 is a sectional view enlargedly showing a part thereof. A stacked semiconductor device 1 shown in these drawings has a wiring board 2 as a circuit substrate for mounting elements. The wiring board 2 may be the one capable of mounting semiconductor elements, and having wiring networks provided at a surface and inside thereof. The circuit substrate may be the one such as a lead frame in which an element mounting portion and a circuit portion are integrated.

An insulating substrate such as a resin substrate, a ceramics substrate and a glass substrate, or a semiconductor substrate can be applied for the substrate constituting the wiring board 2. As a concrete example of the wiring board 2, a print wiring board using a glass-epoxy resin, a BT resin (a Bismaleimide-Triazine resin) and so on can be cited. An element mounting portion 2a is provided at an upper surface (a first principal surface) of the wiring board 2. External connection terminals 3 are provided at a lower surface (a second principal surface) of the wiring board 2.

From FIG. 1 to FIG. 3 show the stacked semiconductor device 1 used as a BGA package. Accordingly, solder bumps are provided at the lower surface of the wiring board 2 as the external connection terminals 3. The stacked semiconductor device 1 is also applicable for an LGA package, and metal lands are provided at the lower surface of the wiring board 2 as the external connection terminals 3 in this case. When the lead frame is used as the circuit substrate, an outer lead functions as the external connection terminal.

There are connection pads 4 provided at a periphery of the element mounting portion 2a on the upper surface of the wiring board 2. The connection pads 4 are electrically connected to the external connection terminals 3 via a wiring network (not-shown). The connection pads 4 become connection portions at the time of wire bonding. A first semiconductor element 5 is adhered on the upper surface (an element mounting surface) of the wiring board 2 via a first adhesive layer 6.

The first semiconductor element 5 has an element main body in which a circuit including a transistor is formed, and first electrode pads 7 disposed at a surface (an upper surface) of the element main body. The upper surface of the first semiconductor element 5 is covered with a first insulating protective film 8 provided so as to expose the first electrode pads 7. An insulating resin layer of a passivation film such as an $SiO_x$ film and $SiN_x$ film, and a polyimide resin layer further formed thereon is applied for the insulating protective film 8.

The first electrode pads 7 are electrically connected to the connection pads 4 of the wiring board 2 via first metal wires 9. An Au wire, a Cu wire, and so on are used for the first metal wire 9. A later-described second metal wire is the same. The first electrode pads 7 are arranged along one side constituting an outline of the first semiconductor element 5, concretely speaking, along one long side. The first semiconductor element 5 has a structure in which the pads are disposed on one long side.

A part of the connection pads 4 of the wiring board 2 are disposed along one long side of the wiring board 2 so as to correspond to the first electrode pads 7. The first metal wires 9 are wired from the connection pads 4 toward the first electrode pads 7. One end of the first metal wire 9 is connected to the connection pad 4, and the other end is connected to the first electrode pad 7. The first semiconductor element 5 may have a structure in which the pads are disposed on one short side, a structure in which the pads are disposed on both short sides, and so on.

A second semiconductor element 10 is adhered on the first semiconductor element 5 via a second adhesive layer 11. The second semiconductor element 10 has an element main body in which a circuit including a transistor is formed, and second electrode pads 12 disposed on a surface (an upper surface) of the element main body. An upper surface of the second semiconductor element 10 is covered with a second insulating protective film 13 provided so as to expose the second electrode pads 12. An insulating resin layer of a passivation film such as an $SiO_x$ film and $SiN_x$ film, and a polyimide resin layer further formed thereon is applied for the insulating protective film 13.

The second electrode pads 12 are arranged along adjacent two sides among sides constituting an outline of the second semiconductor element 10. The second semiconductor element 10 has an L-shaped pad structure. The second electrode pads 12 are electrically connected to the connection pads 4 of the wiring board 2 via second metal wires 14. A part of the connection pads 4 of the wiring board 2 are disposed along one short side and one long side of the wiring board 2 so as to correspond to the second electrode pads 12.

The second metal wires 14 are wired from the connection pads 4 toward the second electrode pads 12. One end of the second metal wire 14 is ball-connected to the connection pad 4. The other end of the second metal wire 14 is connected to a metal bump (an Au bump and so on) 15 formed on the second electrode pad 12 in advance. The second metal wire 14 is connected to the connection pad 4 and the second electrode pad 12 by applying a reverse bonding. Similarly, the reverse bonding is also applied to the first metal wire 9.

As a concrete example of the first semiconductor element 5, a semiconductor memory element such as an NAND type flash memory can be cited. As a concrete example of the second semiconductor element 10, a controller element having a smaller outer shape than the semiconductor memory element can be cited. A semiconductor memory device is constituted by the stacked semiconductor device 1 including the semiconductor memory element and the controller element. The stacked semiconductor device 1 of this embodiment is suitable for the semiconductor memory device.

The first semiconductor element 5 may be a DRAM, a logic element, and so on without being limited to the NAND type flash memory. The second semiconductor element 10 is also not limited to the controller element, but may be a PSRAM (a Pseudo Static RAM) and so on smaller than the NAND type flash memory and so on as same as the controller element. The number of the first semiconductor element 5 is not limited to one but plural semiconductor elements may be stacked and disposed on the wiring board 2.

Figure 4:
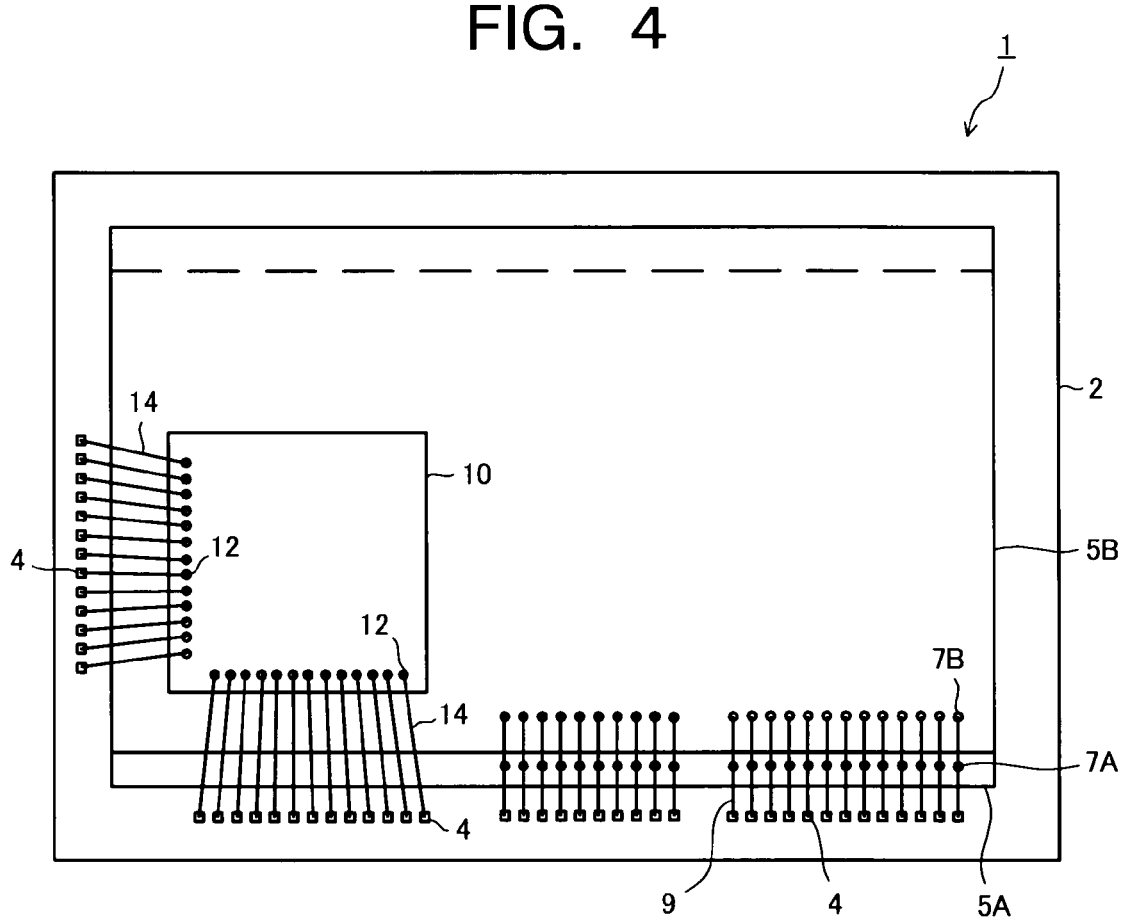
FIG. 4 is a plan view showing a modification example of the stacked semiconductor device shown in FIG. 1.
Figure 5:
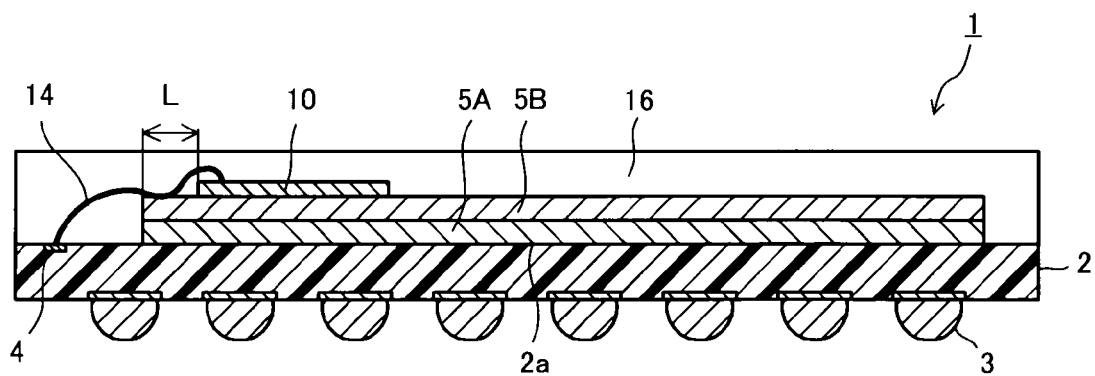
FIG. 5 is a sectional view of the stacked semiconductor device shown in FIG. 4.

FIG. 4 and FIG. 5 show a state in which two semiconductor elements 5A, 5B are stacked and disposed on the wiring board 2, and further, the second semiconductor element 10 is stacked thereon. The two semiconductor elements 5A, 5B are stacked in a step pattern so as to respectively expose electrode pads 7A, 7B. Namely, they are stacked so that short sides of the two semiconductor elements 5A, 5B are aligned, and long sides thereof are slid in the short side direction so as to expose the electrode pads 7A. The electrode pads 7A, 7B are electrically connected to the connection pads 4 via the metal wires 9.

When electric property, signal property, and so on of the electrode pads 7A, 7B are the same, it is possible to connect the metal wire 9 connected to the electrode pad 7B to the electrode pad 7A, and to electrically connect to the connection pad 4 via this electrode pad 7A. Between the electrode pad 7B and the electrode pad 7A, and between the electrode pad 7A and the connection pad 4 may be connected individually by two metal wires 9, or they may be sequentially connected by one metal wire 9.

The number of stacked layers of the first semiconductor elements 5 may be three, four, or more. Further, a stacked structure of the plural semiconductor elements 5 is not limited to the step pattern, but it may be the stacked structure in which respective sides of the plural semiconductor elements 5 are aligned. In this case, the electrode pads of the semiconductor element at the lower side are covered by the semiconductor element at the upper side. Accordingly, an adhesive layer having a spacer function is used to adhere between the semiconductor elements. As a result, it becomes possible to prevent a contact of the metal wire connected to the electrode pad of the semiconductor element at the lower side with the semiconductor element at the upper side.

The first and second semiconductor elements 5, 10 stacked on the wiring board 2 are sealed by a sealing resin such as an epoxy resin together with the first and second metal wires 9, 14. A resin-sealing portion 16 sealing the first and second semiconductor elements 5, 10 is provided on the upper surface of the wiring board 2. The resin-sealing portion 16 is composed of a mold resin formed by, for example, a transfer molding. The stacked semiconductor device 1 is constituted by the above. The resin-sealing portion 16 is not shown in FIG. 1 and FIG. 4. The external connection terminals 3 and the resin-sealing portion 16 are not shown in FIG. 3. It is the same in later-described FIG. 6 to FIG. 8.

The stacked semiconductor device 1 constitutes a semiconductor memory device having a stacked multi-chip package structure. The semiconductor memory device includes the semiconductor memory element as the first semiconductor element 5, and the controller element as the second semiconductor element 10. The stacked semiconductor device 1 is not limited to the above, but it may be an SIP (a System in Package) in which a memory element and a logic element are combined. The memory element is not limited to the NAND type flash memory, but a DRAM and NAND types flash memories may be mixedly mounted.

The outer shape of the second semiconductor element 10 at the upper side is smaller compared to that of the first semiconductor element 5 at the lower side, and therefore, length of the second metal wire 14 becomes inevitably long. The second metal wire 14 of which wire length is long is easy to deviate by a resin flow when the resin-sealing portion 16 applying the transfer molding is manufactured. A resin-sealing material, filled into a mold in the transfer molding process, flows in a direction parallel to the surfaces of the semiconductor elements 5, 10. Accordingly, a wire flow making the adjacent second metal wires 14 contact with each other occurs. There is a possibility in which a short-failure may happen resulting from the contact between different potential wires when the potentials of the adjacent second metal wires 14 are different.

The wire flow at the resin-sealing time is easy to occur when a distance L, from an outer side of the second semiconductor element 10 to an outer side of the first semiconductor element 5 along a wiring direction of the second metal wire 14, is long. Concretely speaking, the wire flow is easy to occur when the distance L is 3 mm or more. Further, the wire flow is also easy to occur when a diameter of the second metal wire 14 is small. Concretely speaking, the wire flow is easy to occur when the wire diameter is 25 μm or less.

In this embodiment, a part of the second metal wire 14 is brought into contact with the insulating protective film 8 of the first semiconductor element 5. As shown in FIG. 3, the second metal wire 14 has a first bent portion 17 provided at an end portion of a rising portion from the connection pad 4. The first bent portion 17 is to turn the rising portion of the second metal wire 14 to a direction of the second electrode pad 12. In this embodiment, it is turned in the direction of the insulating protective film 8 of the first semiconductor element 5 by bending the rising portion of the second metal wire 14 a little larger than the normal reverse bonding.

A second bent portion 18 bent in a direction getting away from the first semiconductor element 5 is provided at an intermediate portion of the second metal wire 14. According to the above, the intermediate portion of the second metal wire 14 is landed on the insulating protective film 8. A third bent portion 19 bent in an opposite direction from the second bent portion 18 is further provided in the second metal wire 14 landed on the insulating protective film 8 in a vicinity of a connection portion with the second electrode pad 12. According to the above, an element side end portion of the second metal wire 14 is connected to a metal bump 15 provided on the second electrode pad 12.

Figure 6:
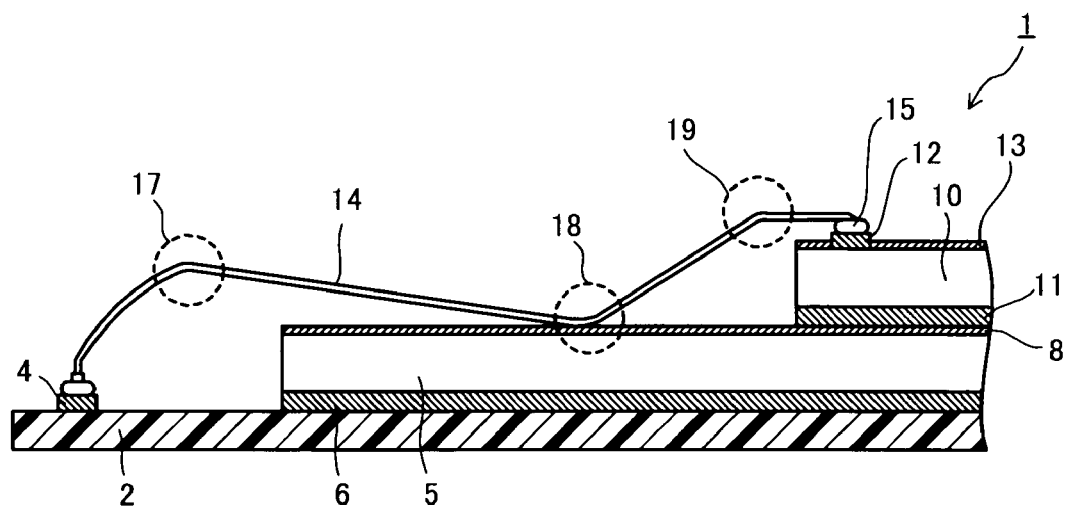
FIG. 6 is a sectional view showing a modification example of the stacked semiconductor device shown in FIG. 3.

The second metal wire 14 shown in FIG. 3 has the second bent portion 18 provided so as to land at an outer peripheral portion side of the first semiconductor element 5. A position of the second bent portion 18 is not limited to the above. The second bent portion 18 may be provided at a position near the second semiconductor element 10, as shown in FIG. 6. The landing position of the second metal wire 14 may be anywhere on the insulating protective film 8, and the second metal wire 14 can be landed at an arbitrary position on the insulating protective film 8.

Further, FIG. 3 and FIG. 6 show a state in which a landing place of the second metal wire 14 for the insulating protective film 8 is one point, but the second metal wire 14 may be landed at plural places for the insulating protective film 8. The second metal wire 14 shown in FIG. 7 has the third bent portion 19 and a fourth bent portion 20 provided in a vicinity of the second bent portion 18 being a first landing point for the insulating protective film 8. The third bent portion 19 is bent in an opposite direction from the second bent portion 18 (a direction heading for the first semiconductor element 5), and the fourth bent portion 20 is bent in an opposite direction from the third bent portion 19 (a direction getting away from the first semiconductor element 5).

The third and fourth bent portions 19, 20 are positioning on the insulating protective film 8. According to the above, the fourth bent portion 20 of the second metal wire 14 is landed on the insulating protective film 8. Namely, the second metal wire 14 is landed on the insulating protective film 8 at two places of the second bent portion 18 and the fourth bent portion 20. A fifth bent portion 21 is provided in a vicinity of the connection portion with the second electrode pad 12, and thereby, the element side end portion of the second metal wire 14 is connected to the metal bump 15 provided on the second electrode pad 12.

Figure 8:
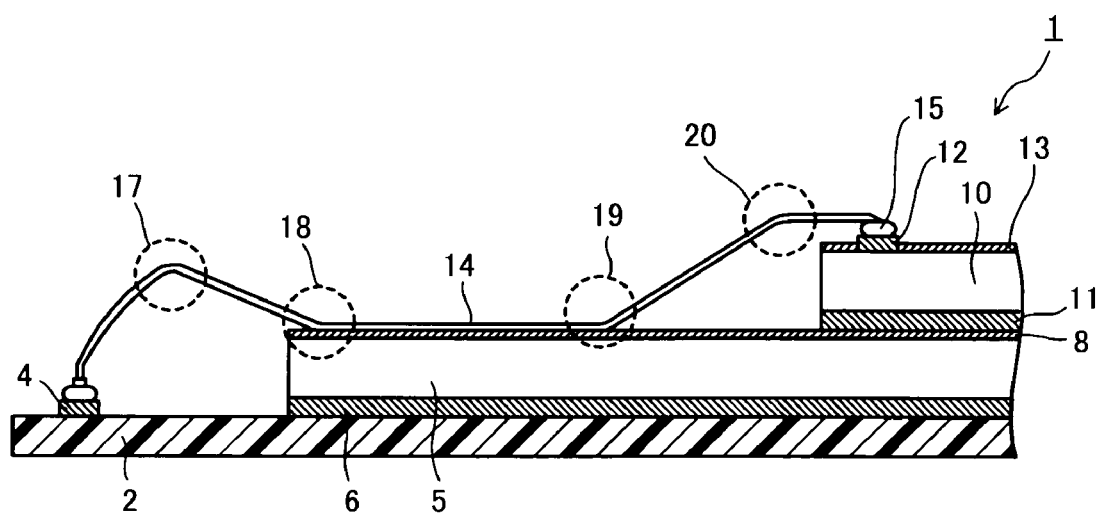
FIG. 8 is a sectional view showing still another modification example of the stacked semiconductor device shown in FIG. 3.

As shown in FIG. 8, the second metal wire 14 may be wired so that a part thereof creeps on the insulating protective film 8. The second metal wire 14 shown in FIG. 8 has the second bent portion 18 and the third bent portion 19 disposed on the insulating protective film 8. A shape of the second metal wire 14 between the second bent portion 18 and the third bent portion 19 is parallel to the insulating protective film 8. The intermediate portion of the second metal wire 14 is thereby crept on the insulating protective film 8. Further, the fourth bent portion 20 is provided at the element side end portion of the second metal wire 14, and thereby, the second metal wire 14 is connected to the second electrode pad 12.

Figure 7:
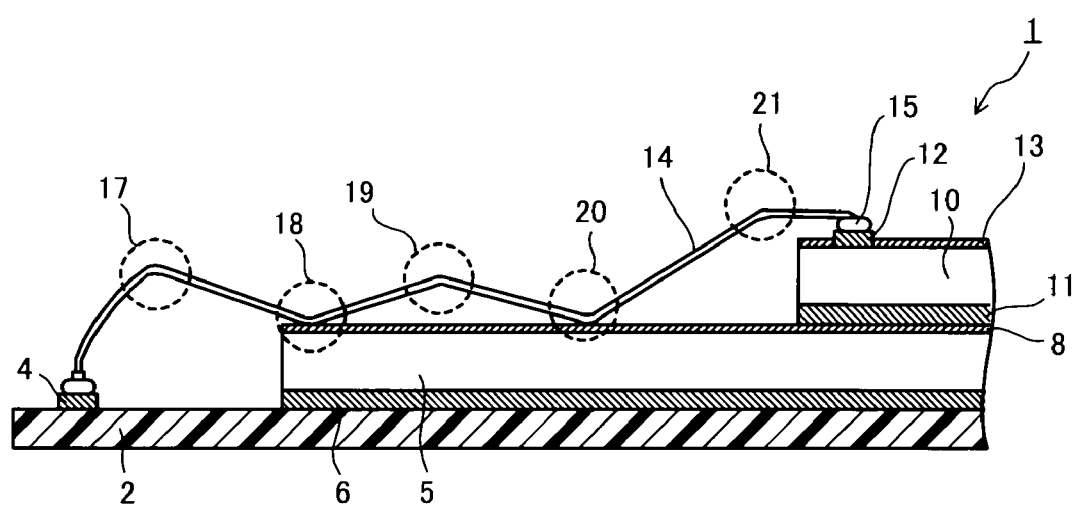
FIG. 7 is a sectional view showing another modification example of the stacked semiconductor device shown in FIG. 3.

The second metal wire 14 is wired so that the intermediate portion thereof is landed on the insulating protective film 8 at one place or plural places, as shown in FIG. 3, FIG. 6, and FIG. 7. Further, the second metal wire 14 is wired so that the intermediate portion thereof creeps on the insulating protective film 8 as shown in FIG. 8. A contact form of the second metal wire 14 for the insulating protective film 8 may be either a landing form or a creeping form.

The bent portion of the second metal wire 14 is formed at a wire looping time. The reverse bonding is applied to the second metal wire 14. At first, the metal bump 15 is formed on the second electrode pad 12. Next, a metal ball is formed at a tip portion of the metal wire held by a bonding tool, and this metal ball is connected to the connection pad 4 of the wiring board 2 (a ball connection). Subsequently, the bonding tool is moved toward upward of the metal bump 15 while forming the wiring loop by winding off the metal wire from the bonding tool.

At this time, a moving direction of the bonding tool is controlled, and thereby, the bent portion (a kink in the wire) is formed in the metal wire. The required number of bent portions are formed in the metal wire. In case of the wire shape shown in FIG. 3, the bent portions are formed at three places in the metal wire. The metal wire in which the bent portions are formed based on operations of the bonding tool is connected (a stitch connection) to the metal bump 15 as same as the normal reverse bonding, and thereby, the intermediate portion of the metal wire is landed on the insulating protective film 8 based on the shape of the bent portions. It is possible to make the intermediate portion of the second metal wire 14 creep on the insulating protective film 8 depending on the number and shapes of the bent portions.

The reverse bonding has advantages in which loop height of the second metal wire 14 can be lowered, and in addition, the formation of the bent portion is easy. When a normal bonding (a forward bonding) ball-connecting to the electrode pad 12 of the second semiconductor element 10 is applied, it is necessary to make the bonding tool reverse-operate to form the bent portions in the metal wire. The formation of the bent portion is therefore difficult in case of the forward bonding. On the other hand, the bent portion is formed on an extension of normal operations in case of the reverse bonding. Consequently, contact property of the second metal wire 14 for the insulating protective film 8 can be enhanced.

The intermediate portion of the second metal wire 14 is brought into contact with the insulating protective film 8 (by landing or creeping), and thereby, it is possible to prevent the wire flow caused by the resin flow, when the resin-sealing portion 16 is manufactured by applying the transfer molding. This is because the second metal wire 14 is in contact with the insulating protective film 8, and in addition, the bent shape of the second metal wire 14 so as to bring the second metal wire 14 into contact with the insulating protective film 8. Namely, it is possible to make the loop height low by bringing the second metal wire 14 into contact with the insulating protective film 8. Further, wire stiffness is improved because the number of the bent portions of the second metal wire 14 increases. According to the above, it becomes possible to prevent the wire flow at the resin-sealing time.

Further, the second metal wire 14 is easy to fall down caused by the resin flow at the rising portion where the distance from the second electrode pad 12 is long. To solve the problem as stated above, the second metal wire 14 is brought into contact with the insulating protective film 8, and thereby, the distance from the rising portion and the first bent portion 17 to a position to be a fulcrum (here, the contact portion for the insulating protective film 8) becomes short. Accordingly, it is suppressed that the rising portion of the second metal wire 14 falls down caused by the resin flow.

A suppression effect of the wire flow owing to the contact of the second metal wire 14 with the insulating protective film 8 is in effect when the distance L from the outer side of the second semiconductor element 10 to the outer side of the first semiconductor element 5 along the wiring direction is 3 mm or more, and the wire diameter of the second metal wire 14 is 25 μm or less. The second semiconductor element 10 is disposed on the first semiconductor element 5 so that the distance L becomes 3 mm or more in the stacked semiconductor device 1 of this embodiment. The second metal wire 14 has the wire diameter of 25 μm or less. The wire flow in the case is prevented.

The wire flow of the second metal wire 14 caused by the resin flow is prevented, and thereby, it is possible to suppress the occurrence of the short-failure caused by the contact between the different potential wires. Accordingly, it is possible to improve manufacturing yield and reliability of the stacked semiconductor device 1. Further, it is possible to select a resin specialized in a suppression of the other problems (for example, filling performance of the sealing resin, a warpage, and so on), because it is not necessary to consider the prevention of the wire flow when the sealing resin is selected. Accordingly, the manufacturing yield of the stacked semiconductor device 1 can further be improved. According to this embodiment, it becomes possible to provide the stacked semiconductor device 1 which excels in the reliability with high yield.

Incidentally, the present invention is not limited to the above-stated embodiments, but it can be applied to various stacked semiconductor device and semiconductor memory device in which plural semiconductor elements are stacked and mounted on a circuit substrate, and wire bonding is applied for a connection of respective semiconductor elements. The stacked semiconductor device and semiconductor memory device as stated above are included in the present invention. Besides, embodiments of the present invention can be expanded/modified without departing from the spirit or essential characteristics thereof, and such expanded/modified embodiments are also included in the technical scope of the present invention.

What is claimed is:

1. A stacked semiconductor device, comprising:
   a circuit substrate having an element mounting portion and connection portions;
   a first semiconductor element, mounted on the element mounting portion of the circuit substrate, having a first element main body, first electrode pads disposed at a surface of the first element main body, and a first insulating protective film covering the surface while exposing the first electrode pads;
   a second semiconductor element, stacked on the first semiconductor element, having a second element main body, second electrode pads disposed at a surface of the second element main body, and a second insulating protective film covering the surface while exposing the second electrode pads;
   first metal wires electrically connecting the connection portions and the first electrode pads;
   second metal wires electrically connecting the connection portions and the second electrode pads, the second metal wires being wired so that a part thereof is in contact with the first insulating protective film; and
   a resin-sealing portion sealing the first and second semiconductor elements together with the first and second metal wires.

2. The stacked semiconductor device according to claim 1, wherein the second metal wire is wired so that an intermediate portion thereof lands on the first insulating protective film at one place.

3. The stacked semiconductor device according to claim 1, wherein the second metal wire is wired so that an intermediate portion thereof lands on the first insulating protective film at plural places.

4. The stacked semiconductor device according to claim 1, wherein the second metal wire is wired so that an intermediate portion thereof creeps on the first insulating protective film.

5. The stacked semiconductor device according to claim 1, wherein the second semiconductor element has a smaller outer shape than that of the first semiconductor element.

6. The stacked semiconductor device according to claim 1, wherein the second semiconductor element is disposed on the first semiconductor element so that a distance from an outer side of the second semiconductor element to an outer side of the first semiconductor element is 3 mm or more.

7. The stacked semiconductor device according to claim 1, wherein the second metal wire has a diameter of 25 µm or less.

8. The stacked semiconductor device according to claim 1, wherein one end of the second metal wire is ball-connected to the connection portion of the circuit substrate, and the other end of the second metal wire is connected to a metal bump formed on the second electrode pad.

9. The stacked semiconductor device according to claim 1, wherein the second metal wire has a first bent portion provided at an end portion of a rising portion from the connection portion, a second bent portion provided in a vicinity of a contact portion with the first insulating protective film and bent in a direction getting away from the first semiconductor element, and a third bent portion provided in a vicinity of a connection part with the second electrode pad and bent in an opposite direction from the second bent portion.

10. The stacked semiconductor device according to claim 1, wherein the circuit substrate includes a wiring board; and wherein the wiring board includes a first surface having the element mounting portion and the connection portions, and a second surface having external connection terminals.

11. A semiconductor memory device, comprising:
a circuit substrate having an element mounting portion and connection portions;
a memory element group including at least one semiconductor memory element mounted on the element mounting portion of the circuit substrate, the semiconductor memory element having an element main body, first electrode pads disposed at a surface of the element main body, and an insulating protective film covering the surface while exposing the first electrode pads;
a controller element, stacked on the memory element group, having second electrode pads;
first metal wires electrically connecting the connection portions and the first electrode pads;
second metal wires electrically connecting the connection portions and the second electrode pads, the second metal wires being wired so that a part thereof is in contact with the insulating protective film of the semiconductor memory element; and
a resin-sealing portion sealing the memory element group and the controller element together with the first and second metal wires.

12. The semiconductor memory device according to claim 11, wherein the second metal wire is wired so that an intermediate portion thereof lands on the insulating protective film at one place.

13. The semiconductor memory device according to claim 11, wherein the second metal wire is wired so that an intermediate portion thereof lands on the insulating protective film at plural places.

14. The semiconductor memory device according to claim 11, wherein the second metal wire is wired so that an intermediate portion thereof creeps on the insulating protective film.

15. The semiconductor memory device according to claim 11, wherein the controller element has a smaller outer shape than that of the semiconductor memory element.

16. The semiconductor memory device according to claim 11, wherein the controller element is disposed on the semiconductor memory element so that a distance from an outer side of the controller element to an outer side of the semiconductor memory element is 3 mm or more.

17. The semiconductor memory device according to claim 11, wherein one end of the second metal wire is ball-connected to the connection portion of the circuit substrate, and the other end of the second metal wire is connected to a metal bump formed on the second electrode pad.

18. The semiconductor memory device according to claim 11, wherein the second metal wire has a first bent portion provided at an end portion of a rising portion from the connection portion, a second bent portion provided in a vicinity of a contact portion with the insulating protective film and bent in a direction getting away from the semiconductor memory element, and a third bent portion provided in a vicinity of a connection part with the second electrode pad and bent in an opposite direction from the second bent portion.

19. The semiconductor memory device according to claim 11, wherein the circuit substrate includes a wiring board; and wherein the wiring board includes a first surface having the element mounting portion and the connection portions, and a second surface having external connection terminals.

20. The semiconductor memory device according to claim 11, wherein the memory element group includes a plurality of the semiconductor memory elements, and the plurality of semiconductor memory elements are stacked on the element mounting portion of the circuit substrate.

* * * * *